(12) United States Patent
Li

(10) Patent No.: US 12,033,942 B2
(45) Date of Patent: Jul. 9, 2024

(54) INTEGRATED CIRCUIT MEMORY AND THE METHOD OF FORMING THE SAME

(71) Applicant: CHANGXIN MEMORY TECHNOLOGIES, INC., Hefei (CN)

(72) Inventor: Yukun Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 405 days.

(21) Appl. No.: 17/599,772

(22) PCT Filed: Jun. 30, 2021

(86) PCT No.: PCT/CN2021/103717
§ 371 (c)(1),
(2) Date: Sep. 29, 2021

(87) PCT Pub. No.: WO2022/062544
PCT Pub. Date: Mar. 31, 2022

(65) Prior Publication Data
US 2023/0053536 A1 Feb. 23, 2023

(30) Foreign Application Priority Data
Sep. 28, 2020 (CN) .......................... 202011042960.6

(51) Int. Cl.
*H01L 23/528* (2006.01)

(52) U.S. Cl.
CPC ................................. *H01L 23/528* (2013.01)

(58) Field of Classification Search
CPC ... H01L 23/528; H01L 27/0207; H10B 12/50; H10B 12/488; G11C 5/02
See application file for complete search history.

(56) References Cited

U.S. PATENT DOCUMENTS 5,328,810 A * 7/1994 Lowrey ............... H01L 21/0338
430/314
6,930,324 B2  8/2005 Kowalski et al.
(Continued)

FOREIGN PATENT DOCUMENTS

CN      1761063 A      4/2006
CN      207938611   * 10/2018 ........... H01L 27/108
(Continued)

OTHER PUBLICATIONS

First CN Office Action cited in CN202011042960.6, mailed May 31, 2023, 9 pages.
(Continued)

*Primary Examiner* — Galina G Yushina
(74) *Attorney, Agent, or Firm* — Kilpatrick Townsend & Stockton LLP

(57) ABSTRACT

The present disclosure provides an integrated circuit memory and the method of forming the same, the memory includes: a substrate; a conducting line group, formed on the substrate, and including a plurality of conducting lines sequentially arranged along a first direction, each conducting line extending in a second direction, and ends of two adjacent conducting lines on a same side being staggered from each other in the second direction; and a plurality of contact pads, formed on the substrate, one of the contact pads being connected to an end of one conducting line, and two adjacent contact pads located on the same side being staggered in the second direction.

9 Claims, 4 Drawing Sheets

S100 — providing a substrate, in which a plurality of active areas arranged in an array are provided S200 — forming a conducting line group in the substrate, comprising a plurality of conducting lines sequentially arranged along a first direction, each conducting line extending in a second direction and being connected to the corresponding active area, and the ends of two adjacent conducting lines on the same side being staggered from each other in the second direction S300 — forming a plurality of contact pads on the substrate, one contact pad being connected to an end of one conducting line, and two adjacent contact pads located on the same side being staggered in the second direction

(56) References Cited

U.S. PATENT DOCUMENTS

| | | | |
|---|---|---|---|
| 2006/0273457 A1* | 12/2006 | Sel | H01L 27/105 |
| | | | 257/734 |
| 2007/0158688 A1 | 7/2007 | Caspary et al. | |
| 2007/0218627 A1* | 9/2007 | Lattard | H10B 99/00 |
| | | | 430/394 |
| 2007/0285983 A1 | 12/2007 | Ishii et al. | |
| 2010/0200929 A1 | 8/2010 | Shin et al. | |
| 2011/0235386 A1 | 9/2011 | Ishii et al. | |
| 2012/0289039 A1* | 11/2012 | Kajiwara | H01L 21/32139 |
| | | | 438/588 |
| 2014/0117492 A1 | 5/2014 | Kim et al. | |

FOREIGN PATENT DOCUMENTS

| | | |
|---|---|---|
| CN | 207938611 U | 10/2018 |
| CN | 110391234 A | 10/2019 |
| CN | 110534517 A | 12/2019 |
| JP | H0982710 A | 3/1997 |
| JP | 2012094929 A | 5/2012 |
| JP | 2013235908 A | 11/2013 |

OTHER PUBLICATIONS

International Search Report cited in PCT/CN2021/103717 dated Sep. 24, 2021, 8 pages.

* cited by examiner

INTEGRATED CIRCUIT MEMORY AND THE METHOD OF FORMING THE SAME

CROSS-REFERENCE TO RELATED APPLICATIONS

The present application is a national stage of International Application No. PCT/CN2021/103717, filed on Jun. 30, 2021, which claims the priority to Chinese Patent Application No. 202011042960.6, titled "Integrated circuit memory and the method of forming the same", filed on Sep. 28, 2020. The entire contents of International Application No. PCT/CN2021/103717 and Chinese Patent Application No. 202011042960.6 are incorporated herein by reference

TECHNICAL FIELD

The present disclosure relates to the technical field of semiconductor integrated circuits, and particularly relates to integrated circuit memory and the method of forming the same.

BACKGROUND

An integrated circuit memory usually comprises a memory array that has a plurality of memory units arranged in an array. The integrated circuit memory further comprises a plurality of conducting lines (e.g., a plurality of word lines and a plurality of bit lines), and each of the word and bit lines is connected to a corresponding memory unit to realize the memory function.

In the manufacturing process of the integrated circuit memory, after the pitching doubling process is completed for the conducting lines (e.g., word lines and bit lines), the tail ends of the conducting lines are cut off straightly to form independent conducting lines, and the tail ends of the word lines and the bit lines are connected with the control circuit through contact pads in the subsequent manufacturing process, realizing the orderly control of the word lines and the bit lines. However, with the evolution of Moore's Law to the level of 1×nm, the layout of active areas is required to be denser, and the line width and distance of the word lines and the bit lines are also reduced. This requires that the contact pads be made smaller, and the engraving accuracy between the contact pads and the word lines or the bit lines be controlled during the subsequent contact pad manufacturing process.

However, in the actual process, it is difficult to realize a completely satisfactory process effect due to the limitation of the photo-etching process window; therefore, the above method of making the small contact pads is likely to cause the connection failure of the conducting lines in the integrated circuit memory, such as open circuit between the conducting lines and the contact pads, and short circuit between the conducting lines.

SUMMARY

The present invention provides an integrated circuit memory and the forming method thereof.

The first aspect of the present application provides an integrated circuit memory, comprising:
  a substrate;
  a conducting line group, formed on the substrate, and comprising a plurality of conducting lines sequentially arranged along a first direction, each conducting line extending in a second direction, and ends of two adjacent conducting lines on a same side being staggered from each other in the second direction;
  a plurality of contact pads, formed on the substrate, one of the contact pads being connected to an end of one conducting line, and two adjacent contact pads located on the same side being staggered in the second direction.

The second aspect of the present application provides a method for forming an integrated circuit memory, comprising:
  providing a substrate;
  forming a conducting line group on the substrate, comprising a plurality of conducting lines sequentially arranged along a first direction, each conducting line extending in a second direction, and ends of two adjacent conducting lines on a same side being staggered from each other in the second direction;
  forming a plurality of contact pads on the substrate, one of the contact pads being connected to an end of one conducting line, and two adjacent contact pads located on the same side being staggered in the second direction.

BRIEF DESCRIPTION OF THE DRAWINGS

The drawings here, which are incorporated into and form part of the specification, illustrate embodiments of the present disclosure, and serve to explain the principle of the present disclosure together with the specification.

Figure 1:
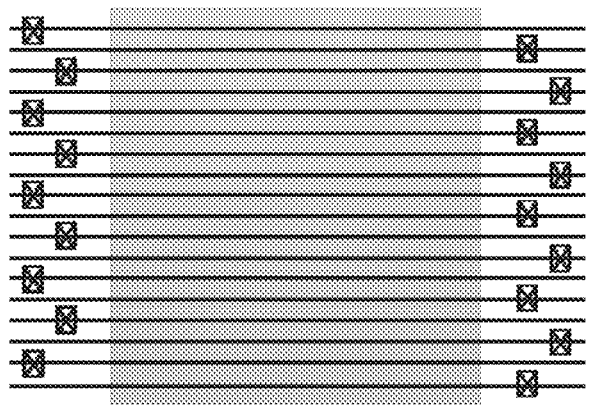
FIG. 1 is a schematic structural diagram of an existing integrated circuit.

Specific embodiments of the present disclosure are shown in the above drawings, and will be described in more detail below. The drawings and written descriptions are not intended to limit the scope of conception of the present disclosure in any manner, but to illustrate the concepts of the present disclosure to those skilled in the art with reference to specific embodiments.

DETAILED DESCRIPTION

Exemplary embodiments will be described in greater detail here, with examples in the drawings. When the following description involves any drawing, the same number in different drawings represents the same or a similar element unless otherwise indicated. The embodiments described in the following exemplary embodiments do not represent all embodiments consistent with the present disclosure. Rather, they are merely examples of devices and methods consistent with certain aspects of the present disclosure, as detailed in the attached claims.

Figure 2:
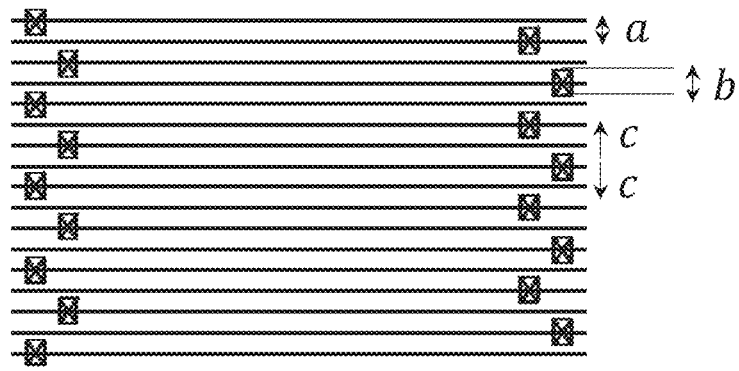
FIG. 2 is a location distribution map of the existing conducting line group and contact pads.

FIG. 1 is a schematic structural diagram of an existing integrated circuit memory, and FIG. 2 is a location distribution map of an existing conducting line group and contact pads. As shown in FIG. 1 and FIG. 2, in the prior art, in the manufacturing process of an integrated circuit memory, after an active area is formed on a substrate, it is necessary to further form a conducting line group, i.e., a word line group and a bit line group, on the substrate. Since the distance between adjacent word lines in the word line group is usually smaller than the distance between adjacent bit lines in the bit line group, the process of forming the word line group can be illustrated as an example, and the process of forming the bit line group can be deduced by analogy.

After the pitching doubling process is completed for the word lines, the tail ends are cut off straightly to form independent word lines, and then a plurality of contact pads are formed, in which one of the contact pads is connected with the end of one of the word lines.

With continued reference to FIG. 2, although the contact pads of two adjacent word lines are disposed at two opposite ends in the prior art, since the ends of the word lines are aligned in the prior art, the area in which the contact pad on each word line can be disposed is limited by the distance between two adjacent word lines. If the contact pad is not formed on the corresponding word line to form effective communication, open circuit between the contact pad and the word line will occur, and if the setup of the contact pad causes the conduction of two adjacent word lines through the contact pad, short circuit between two adjacent word lines will occur.

In order to be able to explain more clearly, it is assumed that the distance between the word lines is a, the size of the contact pad perpendicular to the word line direction is b, and the engraving accuracy of the contact pad perpendicular to the word line direction is c.

Condition 1 that does not result in open circuit between the contact pad and the word line is:

$$\frac{b}{2} - c > 0$$

Condition 2 that does not cause short circuit between two adjacent word lines due to the contact pad is:

$$a - \frac{b}{2} - c > 0$$

Comprehensive consideration of condition 1 and condition 2, it can be concluded that condition 3 that it will not cause the open circuit between the contact pad and the word line, nor will it cause the short circuit between two adjacent word lines due to the contact pad is:

$$2(a-c) > b > 2c$$

Therefore, by increasing b, i.e., increasing the size of the contact pad, the limit photolithography process window corresponding to which there is no open circuit between the contact pad and the word line can be effectively enlarged. By increasing a, i.e., increasing the distance between the word lines, the limit photolithography process window corresponding to which there is no short circuit between adjacent word lines can be effectively enlarged. Also, the size of the contact pad is limited by the distance between the word lines.

However, with the evolution of Moore's Law to the level of 1×nm, the layout of active areas is required to be denser, and the line width and distance of the word lines and the bit lines are also reduced. Therefore, it is impractical to increase the distance between the word lines to avoid open circuit between the word lines and the contact pads and short circuit between adjacent word lines.

Therefore, in order to solve the above problems, in the embodiment provided by the present disclosure, the distance between two adjacent contact pads on the same side can be increased, and the distance between the contact pad and the conducting line that may be contacted to the contact pad in the first direction is also increased by staggering the ends of two adjacent conducting lines on the same side from each other in the second direction, and staggering the contact pads at the ends of the conducting lines from each other, thereby enlarging the limit photolithography process window corresponding to which there is no short circuit between adjacent conducting lines; in the meanwhile, the limit photolithography process window corresponding to which there is no open circuit between the contact pad and the conducting line can be enlarged by properly increasing the size of the contact pad perpendicular to the conducting line, so that the risk of open circuit between the contact pad and the conducting line, and short circuit between adjacent conducting lines can be remarkably reduced.

This image processing method is described in detail below with reference to several specific implementations.

Figure 3:
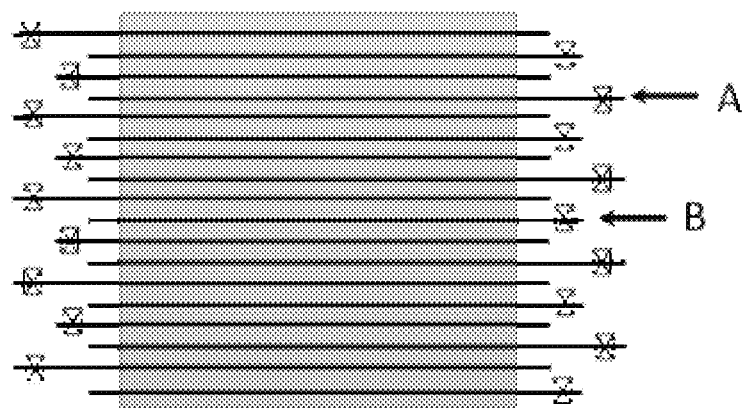
FIG. 3 is a schematic structural diagram of the integrated circuit memory in embodiment 1 of the present disclosure.

FIG. 3 is a schematic structural diagram of the integrated circuit memory in embodiment 1 of the present disclosure. As shown in FIG. 3, the integrated circuit memory provided in this embodiment comprises:

a substrate, in which a plurality of active areas arranged in an array are provided;

a conducting line group, formed on the substrate, and comprising a plurality of conducting lines sequentially arranged along a first direction, each conducting line extending in a second direction and being connected to the corresponding active area, and the ends of two adjacent conducting lines on the same side being staggered from each other in the second direction;

a plurality of contact pads, formed on the substrate, one of the contact pads being connected to an end of one conducting line, and two adjacent contact pads located on the same side being staggered in the second direction.

In this embodiment, the distance between two adjacent contact pads on the same side can be increased, and the distance between the contact pad and the conducting line that may be contacted to the contact pad in the first direction is also increased by staggering the ends of two adjacent conducting lines on the same side from each other in the second direction, and staggering the contact pads on the ends of the conducting lines from each other, thereby enlarging the limit photolithography process window corresponding to which there is no short circuit between adjacent conducting lines; in the meanwhile, the limit photolithography process window corresponding to which there is no open circuit between the contact pad and the conducting line can be enlarged by properly increasing the size of the contact pad perpendicular to the conducting line, so that the risk of open circuit between the contact pad and the conducting line, and short circuit between adjacent conducting lines can be remarkably reduced.

The difference of distance between the ends of two adjacent conducting lines on the same side in the second direction is greater than the width of the contact pad. In addition, the difference of distance of two adjacent contact pads on the same side in the second direction is greater than the width of the contact pads. Therefore, when each contact pad deviates in the first direction in the forming process, short circuit caused by the contact between the contact pad and the adjacent conducting line, or short circuit caused by the contact between adjacent contact pads can be avoided.

Figure 4:
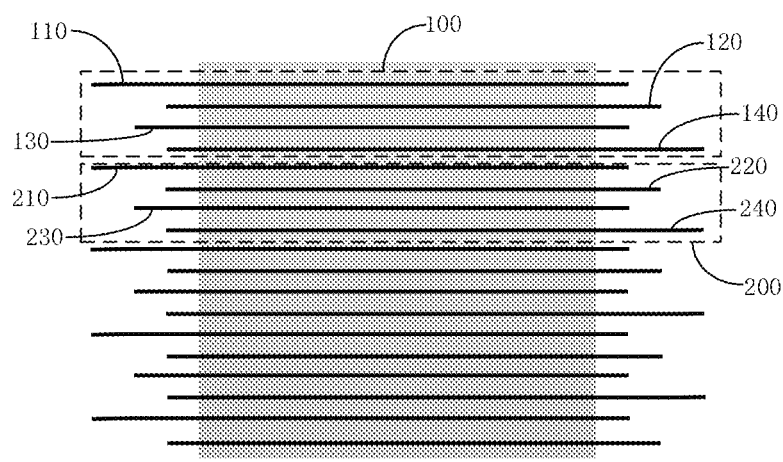
FIG. 4 is a location distribution map of the conducting line group in embodiment 1 of the present disclosure.
Figure 5:
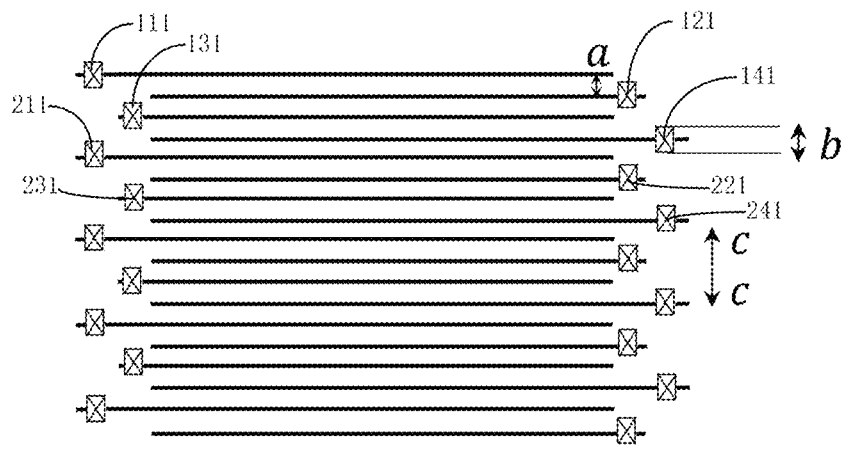
FIG. 5 is a location distribution map of the conducting line group and contact pads in embodiment 1 of the present disclosure.

Moreover, since the distance between adjacent word lines in the word line group is usually smaller than the distance between adjacent bit lines in the bit line group, the process of forming the word line group can be illustrated as an example, and the process of forming the bit line group can be deduced by analogy. This is not repeated here. FIG. 4 is a location distribution map of the conducting line group in embodiment 1 of the present disclosure, and FIG. 5 is a location distribution map of the conducting line group and contact pads in embodiment 1 of the present disclosure. As shown in FIG. 4 and FIG. 5, each of the word lines has a first end and a second end opposite to each other in the second direction, and the two corresponding contact pads on two adjacent word lines are respectively formed on the first end of one word line and the second end of another word line. That is to say, the contact pad of one word line is formed on the first end of the word line corresponding thereto, and the contact pad of the other word line is formed on the second end of the word line corresponding thereto. Specifically, please focus on FIG. 5, the first contact pad 111 on the first word line 110 is disposed on the left end, and the second contact pad 121 on the second word line 120 adjacent to the first word line 110 is disposed on the right end, so that the contact pads between the adjacent word lines are distributed on two ends, thereby reducing the risk of short circuit between the adjacent word lines due to the contact pads.

With continued reference to FIG. 4 and FIG. 5, the word line group may further include a plurality of word line subgroups arranged sequentially in the first direction. The word line subgroup comprises a plurality of word lines which are arranged sequentially in the first direction. Therefore, each of the word line subgroups in the word line group comprises a plurality of word lines which are arranged according to the same distribution rule, thereby ensuring the regular layout of the tail ends of the word lines in the word line group. The word line group may comprise a first word line subgroup 100 and a second word line subgroup 200 adjacently arranged in the first direction, wherein the word lines in the first word line subgroup 100 and the second word line subgroup 200 are arranged according to the same distribution rule.

The first word line subgroup 100 may include: a first word line 110, a second word line 120, a third word line 130, and a fourth word line 140. In the first word line subgroup 100, the first end of the first word line 110 has the longest extension in the second direction, and the second end of the fourth word line 140 has the longest extension in the second direction, that is, the first word line 110 has the longest extension to the left, and the fourth word line 140 has the longest extension to the right.

Wherein, the extension of the second end of the first word line 110 and the extension of the second end of the third word line 130 are same in the second direction. That is to say, the first word line 110 has the same rightward extension as the third word line 130.

The extension of the first end of the second word line 120 and the extension of the first end of the fourth word line 140 are same in the second direction. That is to say, the second word line 120 has the same leftward extension as the fourth word line 140.

The extension of the first end of the third word line 130 in the second direction is between the extension of the first end of the first word line 110 and the extension of the first end of the second word line 120 in the second direction. That is to say, the leftward extension of the third word line 130 is shorter than that of the first word line 110, but is longer than that of the second word line 120.

The extension of the second end of the second word line 120 in the second direction is between the extension of the second end of the first word line 110 and the extension of the second end of the fourth word line 140 in the second direction. That is to say, the leftward extension of the second word line 120 is shorter than that of the fourth word line 140, but is longer than that of the first word line 110.

Also, a first contact pad 111 is formed on the first end of the first word line 110, a second contact pad 121 is formed on the second end of the second word line 120, a third contact pad 131 is formed on the first end of the third word line 130, and a fourth contact pad 141 is formed on the second end of the fourth word line 140.

In addition, the difference of distance between the first end of the third contact pad 131 and the first end of the fourth line 140 in the second direction is greater than the width of the third contact pad 131, i.e., the projection of the third contact pad 131 in the first direction is outside of the first end of the fourth word line 140.

The difference of distance between the first end of the third contact pad 131 and the first end of the second word line 120 in the second direction is greater than the width of the third contact pad 131, i.e., the projection of the third contact pad 131 in the first direction is outside of the first end of the second word line 120.

The difference of distance between the first end of the first contact pad 111 and the first end of the third word line 130 in the second direction is greater than the width of the first contact pad 111, that is, the projection of the first contact pad 111 in the first direction is outside of the first end of the third word line 130.

The difference of distance between the second end of the second contact pad 121 and the second end of the first word line 110 in the second direction is greater than the width of the second contact pad 121, i.e., the projection of the second contact pad 121 in the first direction is outside of the second end of the first word line 110.

The difference of distance between the second end of the second contact pad 121 and the second end of the third word line 130 in the second direction is greater than the width of the second contact pad 121, i.e., the projection of the second contact pad 121 in the first direction is outside of the second end of the third word line 130.

The difference of distance between the second end of the fourth contact pad 141 and the second end of the second word line 120 in the second direction is greater than the width of the fourth contact pad 141, i.e., the projection of the fourth contact pad 141 in the first direction is outside of the second end of the second word line 120.

The second word line subgroup 200 may comprise a fifth word line 210, a sixth word line 220, a seventh word line 230, and an eighth word line 240. In the first word line subgroup 100, the first end of the fifth word line 210 has the longest extension in the second direction, and the second end of the eighth word line 240 has the longest extension in the second direction, that is, the fifth word line 210 has the longest extension to the left, and the eighth word line 240 has the longest extension to the right.

Wherein, the extension of the second end of the fifth word line 210 and the extension of the second end of the seventh word line 230 are same in the second direction. That is to say, the fifth word line 210 has the same rightward extension as the seventh word line 230.

The extension of the first end of the sixth word line 220 and the extension of the first end of the fourth word line 240 are same in the second direction. That is to say, the sixth word line 220 has the same leftward extension as the sixth word line 220.

The extension of the first end of the seventh word line 230 in the second direction is between the extension of the first end of the fifth word line 210 and the extension of the first end of the sixth word line 220. That is to say, the leftward extension of the seventh word line 230 is shorter than that of the fifth word line 210, but is longer than that of the sixth word line 220.

The extension of the second end of the sixth word line 220 in the second direction is between the extension of the second end of the fifth word line 210 and the extension of the second end of the eighth word line 240. That is to say, the leftward extension of the sixth word line 220 is shorter than that of the eighth word line 240, but is longer than that of the fifth word line 210.

Also, a fifth contact pad 211 is formed on the first end of the fifth word line 210, a sixth contact pad 221 is formed on the second end of the sixth word line 220, a seventh contact pad 231 is formed on the first end of the seventh word line 230, and an eighth contact pad 241 is formed on the second end of the eighth word line 240.

In addition, the difference of distance between the first end of the seventh contact pad 231 and the first end of the eighth word line 240 in the second direction is greater than the width of the seventh contact pad 231, i.e., the projection of the seventh contact pad 231 in the first direction is outside of the first end of the eighth word line 240.

The difference of distance between the first end of the seventh contact pad 231 and the first end of the sixth word line 220 in the second direction is greater than the width of the seventh contact pad 231, i.e., the projection of the seventh contact pad 231 in the first direction is outside of the first end of the sixth word line 220.

The difference of distance between the first end of the fifth contact pad 211 and the first end of the seventh word line 230 in the second direction is greater than the width of the fifth contact pad 211, i.e., the projection of the fifth contact pad 211 in the first direction is outside of the first end of the seventh word line 230.

The difference of distance between the second end of the sixth contact pad 221 and the second end of the fifth word line 210 in the second direction is greater than the width of the sixth contact pad 221, i.e., the projection of the sixth contact pad 221 in the first direction is outside of the second end of the fifth word line 210.

The difference of distance between the second end of the sixth contact pad 221 and the second end of the seventh word line 230 in the second direction is greater than the width of the sixth contact pad 221, i.e., the projection of the sixth contact pad 221 in the first direction is outside of the second end of the seventh word line 230.

The difference of distance between the second end of the eighth contact pad 241 and the second end of the sixth word line 220 in the second direction is greater than the width of the eighth contact pad 241, i.e., the projection of the eighth contact pad 241 in the first direction is outside of the second end of the sixth word line 220.

With continued reference to FIG. 5, the first contact pad 111 and the fifth contact pad 211, the second contact pad 121 and the sixth contact pad 221, the third contact pad 131 and the seventh contact pad 231, and the fourth contact pad 141 and the eighth contact pad 241 are respectively aligned in the first direction.

With continued reference to FIG. 3, it can be seen that the first contact pad 111, the fifth contact pad 211, the fourth contact pad 141, and the eighth contact pad 241 can be classified as Class A contact pads, while the second contact pad 121, the sixth contact pad 221, the third contact pad 131, and the seventh contact pad 231 can be classified as Class B contact pads.

For clearer description, with continued reference to FIG. 3 and FIG. 5, it can be assumed that the distance between the word lines is a, the size of the contact pad perpendicular to the word line direction is b, the engraving accuracy of the contact pad perpendicular to the word line direction is c, and the width of the word lines is d.

For a Class A contact pad, condition 4 that does not result in open circuit between the contact pad and the word line is:

$$\frac{b}{2} - c > 0$$

For a Class A contact pad, the condition 5 that does not result in short circuit between two adjacent word lines due to the contact pad is:

$$4a + 3d - \frac{b}{2} - c > 0$$

Comprehensive consideration of condition 4 and condition 5, for a Class A contact pad, condition 6 that it will not cause the open circuit between the contact pad and the word line, nor will it cause the short circuit between two adjacent word lines due to the contact pad occurs is:

$$2(4a+3d-c)>b>2c$$

For a Class B contact pad, the condition 7 that does not result in open circuit between the contact pad and the word line is:

$$\frac{b}{2} - c > 0$$

For a Class B contact pad, the condition 8 that does not result in short circuit of two adjacent word lines due to the contact ad is:

$$2a + d - \frac{b}{2} - c > 0$$

Comprehensive consideration of condition 7 and condition 8, for a Class B contact pad, condition 9 that it will not cause the open circuit between the contact pad and the word line, nor will it cause the short circuit between two adjacent word lines due to the contact pad occurs is:

$$2(2a+d-c)>b>2c$$

Comparing condition 3 from FIG. 2 with conditions 8 and 9 above, it can be seen that for both Class A and Class B contact pads, the limit photolithography process window corresponding to which there is no open circuit between the contact pad and the word line and the limit photolithography process window corresponding to which that there is no short circuit between adjacent word lines are significantly increased. Therefore, in the process of forming the contact pad, the risk of open circuit between the contact pad and the word line and short circuit between adjacent word lines can be remarkably reduced by properly increasing the size of the contact pad perpendicular to the word line direction.

Figure 6:
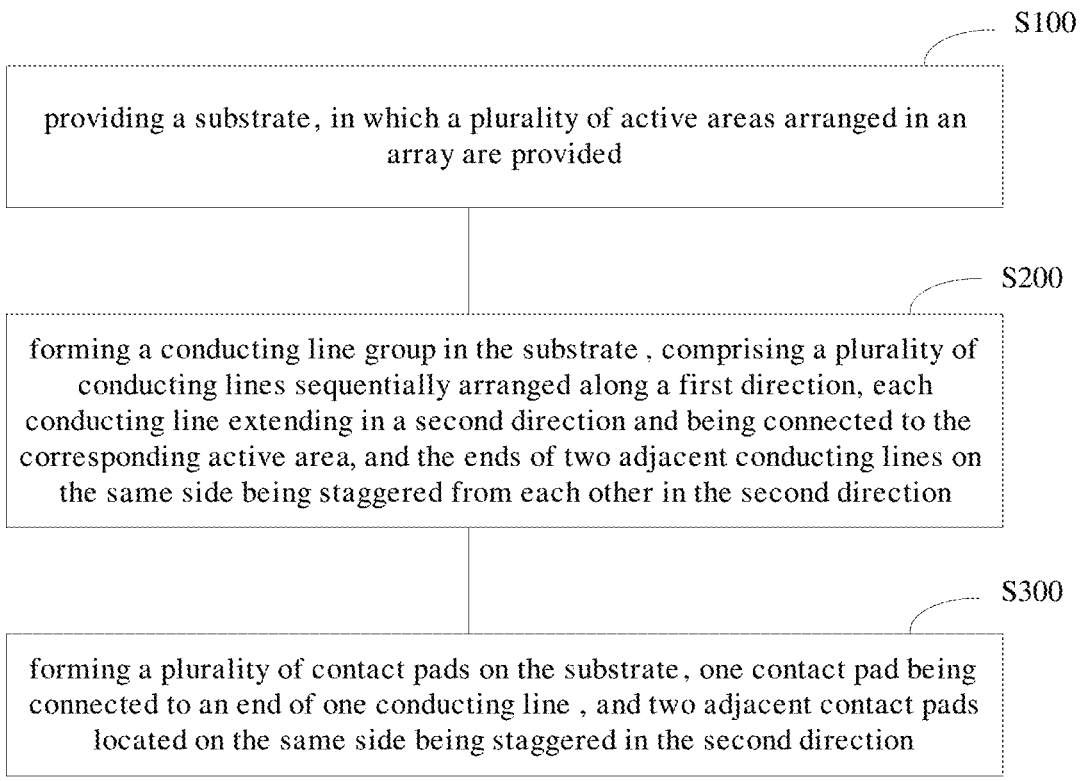
FIG. 6 is a flowchart of the method for forming the integrated circuit memory in embodiment 2 of the present disclosure.

FIG. 6 is a flowchart of the method for forming the integrated circuit memory in embodiment 2 of the present disclosure; As shown in FIG. 6, the method for forming the integrated circuit memory provided in this embodiment, comprising:

S100: providing a substrate, in which a plurality of active areas arranged in an array are provided;

S200: forming a conducting line group on the substrate, comprising a plurality of conducting lines sequentially arranged along a first direction, each conducting line extending in a second direction and being connected to the corresponding active area, and the ends of two adjacent conducting lines on the same side being staggered from each other in the second direction;

S300: forming a plurality of contact pads on the substrate, one contact pad being connected to an end of one conducting line, and two adjacent contact pads located on the same side being staggered in the second direction.

Figure 7:
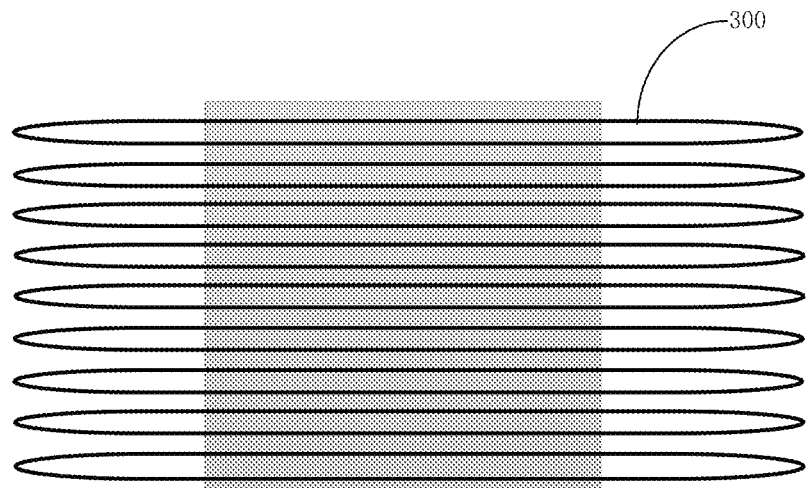
FIG. 7 is a schematic structural diagram of the pitching doubling process in embodiment 2 of the present disclosure.
Figure 8:
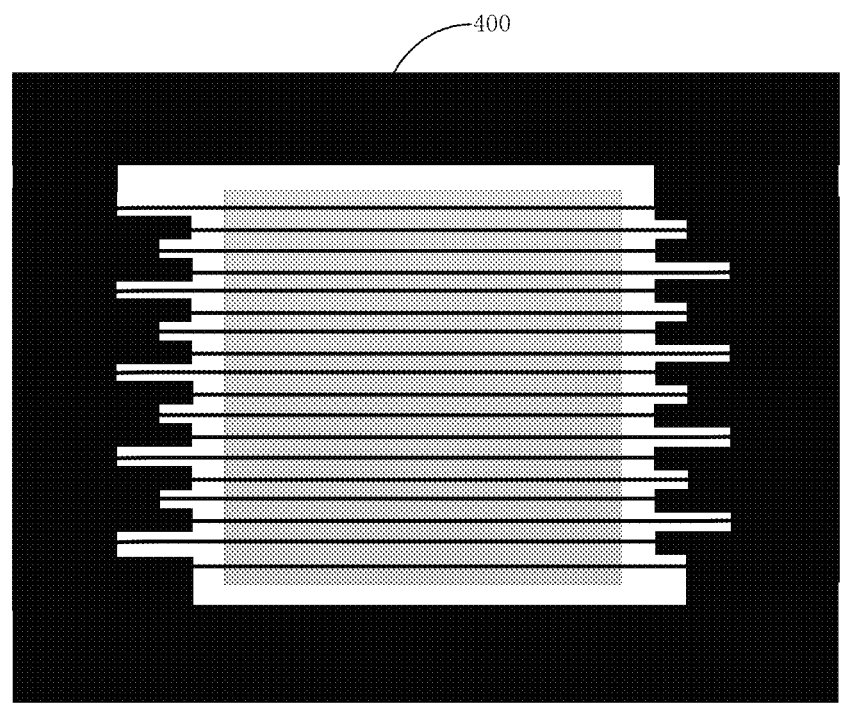
FIG. 8 is a schematic structural diagram after the completion of the pitching doubling process in embodiment 2 of the present disclosure.

FIG. 7 is a schematic structural diagram of the pitching doubling process in embodiment 2 of the present disclosure, and FIG. 8 is a schematic structural diagram after the completion of the pitching doubling process in embodiment 2 of the present disclosure. As shown in FIG. 7 and FIG. 8, after forming the conducting lines to be cut 300 through the pitching doubling process, the conducting lines to be cut 300 are cut through a preset mask layer 400 to form the conducting line group on the substrate.

In this embodiment, the distance between two adjacent contact pads on the same side can be increased, and the distance between the contact pad and the conducting line that maybe contacted to the contact pad in the first direction is also increased by staggering the ends of two adjacent conducting lines on the same side from each other in the second direction, and staggering the contact pads on the ends of the conducting lines from each other, thereby enlarging the limit photolithography process window corresponding to which there is no short circuit between adjacent conducting lines; in the meanwhile, the limit photolithography process window corresponding to which there is no open circuit between the contact pad and the conducting line can be enlarged by properly increasing the size of the contact pad perpendicular to the conducting line, so that the risk of open circuit between the contact pad and the conducting line, and short circuit between adjacent conducting lines can be remarkably reduced.

The difference of distance between the ends of two adjacent conducting lines on the same side in the second direction is greater than the width of the contact pad. In addition, the difference of distance of two adjacent contact pads on the same side in the second direction is greater than the width of the contact pads. Therefore, when each contact pad deviates in the first direction in the forming process, short circuit caused by the contact between the contact pad and the adjacent conducting line, or short circuit caused by the contact between adjacent contact pads can be avoided.

Moreover, since the distance between adjacent word lines in the word line group is usually smaller than the distance between adjacent bit lines in the bit line group, the process of forming the word line group can be illustrated as an example, and the process of forming the bit line group can be deduced by analogy. This is not repeated here. As shown in FIG. 4 and FIG. 5, each of the word lines has a first end and a second end opposite to each other in the second direction, and two corresponding contact pads on two adjacent word lines are respectively formed on the first end of one word line and the second end of another word line. That is to say, the contact pad of one word line is formed on the first end of the word line corresponding thereto, and the contact pad of the other word line is formed on the second end of the word line corresponding thereto. Specifically, please focus on FIG. 5, the first contact pad 111 on the first word line 110 is disposed on the left end, and the second contact pad 121 on the second word line 120 adjacent to the first word line 110 is disposed on the right end, so that the contact pads between the adjacent word lines are distributed on two ends, thereby reducing the risk of short circuit between the adjacent word lines due to the contact pads.

With continued reference to FIG. 4 and FIG. 5, the word line group may further include a plurality of word line subgroups arranged sequentially in the first direction. The word line subgroup comprises a plurality of word lines which are arranged sequentially in the first direction. Therefore, each of the word line subgroups in the word line group comprises a plurality of word lines which are arranged according to the same distribution rule, thereby ensuring the regular layout of the tail ends of the word lines in the word line group. The word line group may comprise a first word line subgroup 100 and a second word line subgroup 200 adjacently arranged in the first direction, wherein the word lines in the first word line subgroup 100 and the second word line subgroup 200 are arranged according to the same distribution rule.

The first word line subgroup 100 may include: a first word line 110, a second word line 120, a third word line 130, and a fourth word line 140. In the first word line subgroup 100, the first end of the first word line 110 has the longest extension in the second direction, and the second end of the fourth word line 140 has the longest extension in the second direction, that is, the first word line 110 has the longest extension to the left, and the fourth word line 140 has the longest extension to the right.

Wherein, the extension of the second end of the first word line 110 and the extension of the second end of the third word line 130 are same in the second direction. That is to say, the first word line 110 has the same rightward extension as the third word line 130.

The extension of the first end of the second word line 120 and the extension of the first end of the fourth word line 140 are same. That is to say, the second word line 120 has the same leftward extension as the fourth word line 140.

The extension of the first end of the third word line 130 in the second direction is between the extension of the first end of the first word line 110 and the extension of the first end of the second word line 120 in the second direction. That is to say, the leftward extension of the third word line 130 is shorter than that of the first word line 110, but is longer than that of the second word line 120.

The extension of the second end of the second word line 120 in the second direction is between the extension of the second end of the first word line 110 and the extension of the second end of the fourth word line 140 in the second direction. That is to say, the leftward extension of the second word line 120 is shorter than that of the fourth word line 140, but is longer than that of the first word line 110.

Also, a first contact pad 111 is formed on the first end of the first word line 110, a second contact pad 121 is formed on the second end of the second word line 120, a third contact pad 131 is formed on the first end of the third word line 130, and a fourth contact pad 141 is formed on the second end of the fourth word line 140.

In addition, the difference of distance between the first end of the third contact pad 131 and the first end of the fourth line 140 in the second direction is greater than the width of the third contact pad 131, i.e., the projection of the third contact pad 131 in the first direction is outside of the first end of the fourth word line 140.

The difference of distance between the first end of the third contact pad 131 and the first end of the second word line 120 in the second direction is greater than the width of the third contact pad 131, i.e., the projection of the third contact pad 131 in the first direction is outside of the first end of the second word line 120.

The difference of distance between the first end of the first contact pad 111 and the first end of the third word line 130 in the second direction is greater than the width of the first contact pad 111, i.e., the projection of the first contact pad 111 in the first direction is outside of the first end of the third word line 130.

The difference of distance between the second end of the second contact pad 121 and the second end of the first word line 110 in the second direction is greater than the width of the second contact pad 121, i.e., the projection of the second contact pad 121 in the first direction is outside of the second end of the first word line 110.

The difference of distance between the second end of the second contact pad 121 and the second end of the third word line 130 in the second direction is greater than the width of the second contact pad 121, i.e., the projection of the second contact pad 121 in the first direction is outside of the second end of the third word line 130.

The difference of distance between the second end of the fourth contact pad 141 and the second end of the second word line 120 in the second direction is greater than the width of the fourth contact pad 141, i.e., the projection of the fourth contact pad 141 in the first direction is outside of the second end of the second word line 120.

The second word line subgroup 200 may comprise a fifth word line 210, a sixth word line 220, a seventh word line 230, and an eighth word line 240. In the first of word line subgroup 100, the first end of the fifth word line 210 has the longest extension in the second direction, and the second end of the eighth word line 240 has the longest extension in the second direction, that is, the fifth word line 210 has the longest extension to the left, and the eighth word line 240 has the longest extension to the right.

Wherein, the extension of the second end of the fifth word line 210 and the extension of the second end of the seventh word line 230 are same in the second direction. That is to say, the fifth word line 210 has the same rightward extension as the seventh word line 230.

The extension of the first end of the sixth word line 220 and the extension of the first end of the fourth word line 240 are the same in the second direction. That is to say, the sixth word line 220 has the same leftward extension as the sixth word line 220.

The extension of the first end of the seventh word line 230 in the second direction is between the extension of the first end of the fifth word line 210 and the extension of the first end of the sixth word line 220. That is to say, the leftward extension of the seventh word line 230 is shorter than that of the fifth word line 210, but is longer than that of the sixth word line 220.

The extension of the second end of the sixth word line 220 in the second direction is between the extension of the second end of the fifth word line 210 and the extension of the second end of the eighth word line 240. That is to say, the leftward extension of the sixth word line 220 is shorter than that of the eighth word line 240, but is longer than that of the fifth word line 210.

Also, a fifth contact pad 211 is formed on the first end of the fifth word line 210, a sixth contact pad 221 is formed on the second end of the sixth word line 220, a seventh contact pad 231 is formed on the first end of the seventh word line 230, and an eighth contact pad 241 is formed on the second end of the eighth word line 240.

In addition, the difference of distance between the first end of the seventh contact pad 231 and the first end of the eighth word line 240 in the second direction is greater than the width of the seventh contact pad 231, i.e., the projection of the seventh contact pad 231 in the first direction is outside of the first end of the eighth word line 240.

The difference of distance between the first end of the seventh contact pad 231 and the first end of the sixth word line 220 in the second direction is greater than the width of the seventh contact pad 231, i.e., the projection of the seventh contact pad 231 in the first direction is outside of the first end of the sixth word line 220.

The difference of distance between the first end of the fifth contact pad 211 and the first end of the seventh word line 230 in the second direction is greater than the width of the fifth contact pad 211, i.e., the projection of the fifth contact pad 211 in the first direction is outside of the first end of the seventh word line 230.

The difference of distance between the second end of the sixth contact pad 221 and the second end of the fifth word line 210 in the second direction is greater than the width of the sixth contact pad 221, i.e., the projection of the sixth contact pad 221 in the first direction is outside of the second end of the fifth word line 210.

The difference of distance between the second end of the sixth contact pad 221 and the second end of the seventh word line 230 in the second direction is greater than the width of the sixth contact pad 221, i.e., the projection of the sixth contact pad 221 in the first direction is outside of the second end of the seventh word line 230.

The difference of distance between the second end of the eighth contact pad 241 and the second end of the sixth word line 220 in the second direction is greater than the width of the eighth contact pad 241, i.e., the projection of the eighth contact pad 241 in the first direction is outside of the second end of the sixth word line 120.

With continued reference to FIG. 5, the first contact pad 111 and the fifth contact pad 211, the second contact pad 121 and the sixth contact pad 221, the third contact pad 131 and the seventh contact pad 231, and the fourth contact pad 141 and the eighth contact pad 241 are respectively aligned in the first direction.

With continued reference to FIG. 3, it can be seen that the first contact pad 111, the fifth contact pad 211, the fourth contact pad 141, and the eighth contact pad 241 can be classified as Class A contact pads, while the second contact pad 121, the sixth contact pad 221, the third contact pad 131, and the seventh contact pad 231 can be classified as Class B contact pads.

For clearer description, with continued reference to FIG. 3 and FIG. 5, it can be assumed that the distance between the word lines is a, the size of the contact pad perpendicular to the word line direction is b, the engraving accuracy of the contact pad perpendicular to the word line direction is c, and the width of the word lines is d.

For a Class A contact pad, condition 4 that does not result in open circuit between the contact pad and the word line is:

$$\frac{b}{2} - c > 0$$

For a Class A contact pad, the condition 5 that does not result in short circuit between two adjacent word lines due to the contact pad is:

$$4a + 3d - \frac{b}{2} - c > 0$$

Comprehensive consideration of condition 4 and condition 5, for a Class A contact pad, condition 6 that it will not cause the open circuit between the contact pad and the word line, nor will it cause the short circuit between two adjacent word lines due to the contact pad occurs is:

$$2(4a+3d-c) > b > 2c$$

For a Class B contact pad, the condition 7 that does not result in open circuit between the contact pad and the word line is:

$$\frac{b}{2} - c > 0$$

For a Class B contact pad, the condition 8 that does not result in short circuit of two adjacent word lines due to the contact pad is:

$$2a + d - \frac{b}{2} - c > 0$$

Comprehensive consideration of condition 7 and condition 8, for a Class B contact pad, condition 9 that it will not cause the open circuit between the contact pad and the word line, nor will it cause the short circuit between two adjacent word lines due to the contact pad occurs is:

$$2(2a+d-c) > b > 2c$$

Comparing condition 3 from FIG. 2 with conditions 8 and 9 above, it can be seen that for both Class A and Class B contact pads, the limit photolithography process window corresponding to which there is no open circuit between the contact pad and the word line and the limit photolithography process window corresponding to which that there is no short circuit between adjacent word lines are significantly increased. Therefore, in the process of forming the contact pad, the risk of open circuit between the contact pad and the word line and short circuit between adjacent word lines can be remarkably reduced by properly increasing the size of the contact pad perpendicular to the word line direction.

Furthermore, the above drawings are only an illustrative description of the processes included in the method according to the exemplary embodiments of the present disclosure, and are not intended to be limiting. It is easily understood that the processes illustrated in the above drawings are not intended to indicate or limit the temporal order of these processes. In addition, it is also easily understood that these processes may be performed, for example, synchronously or asynchronously in multiple modules.

Those skilled in the art can easily think of other embodiments of the present disclosure when considering the specification and practicing the invention disclosed herein. The present disclosure is intended to cover any variants, uses, or adaptations of the present disclosure following the general principles of the present disclosure and including common knowledge or customary technical means in the art not disclosed in the present disclosure. The specification and the embodiments are deemed exemplary only, and the true scope and spirit of the present disclosure are indicated by the following claims.

It should be understood that the present disclosure is not limited to the precise structures that have been described above and shown in the drawings, and that various modifications and changes may be made without departing from the scope thereof. The scope of the present disclosure is limited by the attached claims only.

The invention claimed is:

1. An integrated circuit memory, comprising:
   a substrate;
   a conducting line group, formed on the substrate, and comprising a plurality of conducting lines sequentially arranged along a first direction, each of the plurality of conducting lines extending in a second direction, and ends of two adjacent conducting lines of the plurality of conducting lines on a same side being staggered from each other in the second direction;
   a plurality of contact pads, formed on the substrate, one of the plurality of contact pads being connected to a first end of one of the plurality of conducting lines, and two adjacent contact pads of the plurality of contact pads located on the same side being staggered in the second direction;
   wherein each of the plurality of conducting lines has a first end and a second end opposite to each other in the second direction, and two corresponding contact pads of the plurality of contact pads on the two adjacent conducting lines are respectively formed on the first end of the one of the plurality of conducting lines and a second end of another conducting line of the plurality of conducting lines;
   wherein the conducting line group comprises a plurality of conducting line subgroups arranged sequentially along the first direction;
   wherein a conducting line subgroup of the plurality of conducting line subgroups comprises a first conducting line, a second conducting line, a third conducting line and a fourth conducting line of the plurality of conducting lines;
   in the conducting line subgroup, a first end of the first conducting line has a longest extension in the second direction, and a second end of the fourth conducting line has a longest extension in the second direction;
   an extension of a second end of the first conducting line and an extension of a second end of the third conducting line are same in the second direction;
   an extension of a first end of the second conducting line and an extension of a first end of the fourth conducting line are same in the second direction;
   an extension of a first end of the third conducting line in the second direction is between the longest extension of the first end of the first conducting line and the extension of the first end of the second conducting line in the second direction;

an extension of a second end of the second conducting line in the second direction is between the extension of the second end of the first conducting line and the longest extension of the second end of the fourth conducting line in the second direction;

a first contact pad of the plurality of contact pads is formed on the first end of the first conducting line, a second contact pad of the plurality of contact pads is formed on the second end of the second conducting line, a third contact pad of the plurality of contact pads is formed on the first end of the third conducting line, and a fourth contact pad of the plurality of contact pads is formed on the second end of the fourth conducting line;

wherein the first contact pad and the fourth contact pad are classified as Class A contact pads, while the second contact pad and the third contact pad are classified as Class B contact pads;

for the Class A contact pads, to not cause an open circuit between each of the Class A contact pads and a corresponding one of the plurality of conducting lines and to not cause a short circuit between the two adjacent conducting lines due to the Class A contact pads, the following equation applies:

$2(4a+3d-c) > b > 2c$ for the Class B contact pads, to not cause the open circuit between the Class B contact pads and a corresponding one of the plurality of conducting lines and to not cause the short circuit between the two adjacent conducting lines due to the Class B contact pads, the following equation applies:

$2(2a+d-c) > b > 2c$ a distance between each of the plurality of conducting lines is a, a size of each of a corresponding one of the plurality of contact pads perpendicular to the corresponding conducting line direction is b, an engraving accuracy of the corresponding one of the plurality of contact pads perpendicular to the corresponding conducting line direction is c, and a width of each of the plurality of conducting lines is d.

2. The integrated circuit memory according to claim 1, wherein a distance between the ends of the two adjacent conducting lines on the same side in the second direction is greater than a width of the corresponding one of the plurality of contact pads.

3. The integrated circuit memory according to claim 2, wherein distance between the two adjacent contact pads on the same side is greater than the width of the corresponding one of the plurality of contact pads.

4. The integrated circuit memory according to claim 1, wherein
each of the conducting line subgroups comprises some of the plurality of conducting lines arranged sequentially along the first direction.

5. A method for forming an integrated circuit memory, comprising:
providing a substrate;
forming a conducting line group on the substrate, the conducting line group comprising a plurality of conducting lines sequentially arranged along a first direction, each of the plurality of conducting lines extending in a second direction, and ends of two adjacent conducting lines of the plurality of conducting lines on a same side being staggered from each other in the second direction;

forming a plurality of contact pads on the substrate, one of the plurality of contact pads being connected to a first end of one of the plurality of conducting lines, and two adjacent contact pads of the plurality of contact pads located on the same side being staggered in the second direction;

wherein each of the plurality of conducting lines has a first end and a second end opposite to each other in the second direction, and two corresponding contact pads of the plurality of contact pads on the two adjacent conducting lines are respectively formed on the first end of the one of the plurality of conducting lines and a second end of another conducting line of the plurality of conducting lines;

wherein the conducting line group comprises a plurality of conducting line subgroups arranged sequentially along the first direction;

wherein a conducting line subgroup of the plurality of conducting line subgroups comprises a first conducting line, a second conducting line, a third conducting line and a fourth conducting line of the plurality of conducting lines;

in the conducting line subgroup, a first end of the first conducting line has a longest extension in the second direction, and a second end of the fourth conducting line has a longest extension in the second direction;

an extension of a second end of the first conducting line and an extension of a second end of the third conducting line are same in the second direction;

an extension of a first end of the second conducting line and an extension of a first end of the fourth conducting line are same in the second direction;

an extension of a first end of the third conducting line in the second direction is between the longest extension of the first end of the first conducting line and the extension of the first end of the second conducting line in the second direction;

an extension of a second end of the second conducting line in the second direction is between the extension of the second end of the first conducting line and the longest extension of the second end of the fourth conducting line in the second direction;

a first contact pad of the plurality of contact pads is formed on the first end of the first conducting line, a second contact pad of the plurality of contact pads is formed on the second end of the second conducting line, a third contact pad of the plurality of contact pads is formed on the first end of the third conducting line, and a fourth contact pad of the plurality of contact pads is formed on the second end of the fourth conducting line;

wherein the first contact pad and the fourth contact pad are classified as Class A contact pads, while the second contact pad and the third contact pad are classified as Class B contact pads;

for the Class A contact pads, to not cause an open circuit between each of the Class A contact pads and a corresponding one of the plurality of conducting lines and to not cause a short circuit between the two adjacent conducting lines due to the Class A contact pads, the following equation applies:

$2(4a+3d-c) > b > 2c$ for the Class B contact pads, to not cause the open circuit between each of the Class B contact pads and a corresponding one of the plurality of conducting lines and to not cause the short circuit between the two adjacent conducting lines due to the Class B contact pads, the following equation applies:

$$2(2a+d-c)>b>2c$$

a distance between each of the plurality of conducting lines is a, a size of each of a corresponding one of the plurality of contact pads perpendicular to the corresponding conducting line direction is b, an engraving accuracy of the corresponding one of the plurality of contact pads perpendicular to the corresponding conducting line direction is c, and a width of each of the plurality of conducting lines is d.

6. The method for forming the integrated circuit memory according to claim 5, wherein forming the conducting line group on the substrate, comprises:

after forming conducting lines to be cut through a pitching doubling process, cutting the conducting lines to be cut through a preset mask layer to form the conducting line group on the substrate.

7. The method for forming the integrated circuit memory according to claim 5, wherein a distance between the ends of the two adjacent conducting lines on the same side in the second direction is greater than a width of the corresponding one of the plurality of contact pads.

8. The method for forming the integrated circuit memory according to claim 7, wherein distance between the two adjacent contact pads on the same side is greater than the width of the corresponding one of the plurality of contact pads.

9. The method for forming the integrated circuit memory according to claim 7, wherein
each of the conducting line subgroups comprises some of the plurality of conducting lines arranged sequentially along the first direction.

* * * * *